(12) United States Patent
Liu et al.

(10) Patent No.: US 11,765,830 B2
(45) Date of Patent: Sep. 19, 2023

(54) FLEXIBLE PRINTED CIRCUIT AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Lianbin Liu, Beijing (CN); Hengzhen Liang, Beijing (CN); Xu Lu, Beijing (CN); Xiaolong Zhu, Beijing (CN); Qing Gong, Beijing (CN); Hui Wen, Beijing (CN); Ting Qin, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 225 days.

(21) Appl. No.: 17/435,158

(22) PCT Filed: Dec. 25, 2020

(86) PCT No.: PCT/CN2020/139511
§ 371 (c)(1),
(2) Date: Aug. 31, 2021

(87) PCT Pub. No.: WO2022/134026
PCT Pub. Date: Jun. 30, 2022

(65) Prior Publication Data
US 2022/0210917 A1   Jun. 30, 2022

(51) Int. Cl.
| H05K 1/18 | (2006.01) |
| H05K 1/14 | (2006.01) |
| H05K 1/02 | (2006.01) |
| H05K 1/03 | (2006.01) |
| G01L 9/08 | (2006.01) |
| G01L 9/02 | (2006.01) |
| G01L 9/12 | (2006.01) |

(52) U.S. Cl.
CPC ............. *H05K 1/144* (2013.01); *G01L 9/02* (2013.01); *G01L 9/08* (2013.01); *G01L 9/12* (2013.01);
(Continued)

(58) Field of Classification Search
CPC ... H05K 1/144; H05K 2201/0346; G01L 9/02
(Continued)

(56) References Cited

U.S. PATENT DOCUMENTS 10,705,655 B2   6/2020   Goo et al.
10,833,131 B2   11/2020  Lin et al.
(Continued)

FOREIGN PATENT DOCUMENTS

CN   106325626 A   1/2017
CN   109032416 A   12/2018
(Continued)

*Primary Examiner* — Binh B Tran
(74) *Attorney, Agent, or Firm* — Westman, Champlin & Koehler, P.A.

(57) ABSTRACT

A flexible printed circuit and a display device are provided. The flexible printed circuit includes: a plurality of sub-circuit boards arranged in a stack, wherein the plurality of sub-circuit boards include at least a first sub-circuit board and a second sub-circuit board; and a pressure sensor arranged on the first sub-circuit board, wherein the first sub-circuit board includes: a substrate film; a conductive film arranged on a side of the substrate film away from the second sub-circuit board; an adhesive layer arranged on a side of the conductive film away from the substrate film; a cover layer arranged on a side of the adhesive layer away from the substrate film; and an electromagnetic shielding layer arranged on a side of the cover layer away from the substrate film, wherein at least a part of the conductive film is formed as an electrode of the pressure sensor.

20 Claims, 15 Drawing Sheets

(52) U.S. Cl.
CPC ........... *H05K 1/028* (2013.01); *H05K 1/0218* (2013.01); *H05K 1/0346* (2013.01); *H05K 2201/0154* (2013.01); *H05K 2201/041* (2013.01); *H05K 2201/10128* (2013.01); *H05K 2201/10151* (2013.01)

(58) Field of Classification Search
USPC ......................................................... 361/750
See application file for complete search history.

(56) References Cited

U.S. PATENT DOCUMENTS

| | | | |
|---|---|---|---|
| 11,037,497 | B2 | 6/2021 | Kim et al. |
| 2014/0260550 | A1 | 9/2014 | Kil et al. |
| 2016/0128194 | A1 | 5/2016 | Hong et al. |
| 2018/0160545 | A1* | 6/2018 | Kim .................... H04M 1/0277 |
| 2019/0155449 | A1 | 5/2019 | Goo et al. |
| 2019/0305053 | A1 | 10/2019 | Lin et al. |
| 2020/0168157 | A1 | 5/2020 | Kim et al. |
| 2020/0267293 | A1* | 8/2020 | Noh .................... H10K 50/8426 |
| 2022/0346224 | A1* | 10/2022 | Lee ..................... H05K 5/0226 |

FOREIGN PATENT DOCUMENTS

| | | |
|---|---|---|
| CN | 111221382 A | 6/2020 |
| KR | 1020120021741 A | 3/2012 |
| KR | 1020190018985 A | 2/2019 |
| WO | 2019103343 A1 | 5/2019 |

\* cited by examiner

10'

101'

10"

101"

FLEXIBLE PRINTED CIRCUIT AND DISPLAY DEVICE

CROSS REFERENCE TO RELATED APPLICATION(S)

This application is a Section 371 National Stage Application of International Application No. PCT/CN2020/139511, filed on Dec. 25, 2020, entitled "FLEXIBLE PRINTED CIRCUIT AND DISPLAY DEVICE", the contents of which are incorporated herein by reference in their entireties.

TECHNICAL FIELD

The present disclosure relates to a field of a display technology, and in particular to a flexible printed circuit and a display device.

BACKGROUND

Flexible Printed Circuit (FPC) is a highly reliable and flexible printed circuit board made of a flexible film as a substrate. The flexible printed circuit has characteristics of high wiring density, light weight, small thickness, and good bendability, and may be widely used in various display devices such as mobile phones, computers, and displays.

SUMMARY

According to an aspect of the present disclosure, a flexible printed circuit is provided, and the flexible printed circuit includes: a plurality of sub-circuit boards arranged in a stack, wherein the plurality of sub-circuit boards include at least a first sub-circuit board and a second sub-circuit board; and a pressure sensor arranged on the first sub-circuit board, wherein the first sub-circuit board includes: a substrate film; a conductive film arranged on a side of the substrate film away from the second sub-circuit board; an adhesive layer arranged on a side of the conductive film away from the substrate film; a cover layer arranged on a side of the adhesive layer away from the substrate film; and an electromagnetic shielding layer arranged on a side of the cover layer away from the substrate film, wherein at least a part of the conductive film is formed as an electrode of the pressure sensor.

According to some exemplary embodiments, the flexible printed circuit includes a main body region and a protruding region, the main body region has a thickness in a first direction greater than a thickness of the protruding region in the first direction, and the first direction is perpendicular to a surface of the substrate film away from the second sub-circuit board; and the pressure sensor is arranged in the protruding region.

According to some exemplary embodiments, the first sub-circuit board includes a portion arranged in the main body region and another portion protruding with respect to the main body region; and the another portion of the first sub-circuit board protruding with respect to the main body region forms the protruding region.

According to some exemplary embodiments, a separation distance between the conductive film and the electromagnetic shielding layer in a first direction is within a range of 34.5 microns to 40.5 microns.

According to some exemplary embodiments, the adhesive layer has a thickness of about 25 microns in the first direction.

According to some exemplary embodiments, an orthographic projection of the pressure sensor on the substrate film is spaced from an orthographic projection of the main body region on the substrate film.

According to some exemplary embodiments, the protruding region includes a transition region located between the pressure sensor and the main body region; and the flexible printed circuit includes a plurality of lines arranged in the transition region.

According to some exemplary embodiments, an orthographic projection of the main body region on the substrate film is adjacent to an orthographic projection of the protruding region on the substrate film.

According to some exemplary embodiments, an area of the orthographic projection of the main body region on the substrate film is greater than an area of the orthographic projection of the protruding region on the substrate film.

According to some exemplary embodiments, the protruding region protrudes from a side surface of the main body region, an orthographic projection of the side surface on the substrate film is formed as a dividing line, a ratio of a size of the orthographic projection of the protruding region on the substrate film in a direction perpendicular to the dividing line to a size of the orthographic projection of the main body region on the substrate film in the direction perpendicular to the dividing line is within a range of 0.5 to 1.5.

According to some exemplary embodiments, a ratio of a size of the orthographic projection of the protruding region on the substrate film in a direction parallel to the dividing line to a size of the orthographic projection of the main body region on the substrate film in the direction parallel to the dividing line is within a range of 0.15 to 1.

According to some exemplary embodiments, the size of the orthographic projection of the protruding region on the substrate film in the direction perpendicular to the dividing line is about 13.4 mm; and/or the size of the orthographic projection of the main body region on the substrate film in the direction perpendicular to the dividing line is about 13.5 mm.

According to some exemplary embodiments, the main body region includes a first sub-circuit board and a second sub-circuit board; or the main body region includes a first sub-circuit board, a second sub-circuit board and a third sub-circuit board; or the main body region includes a first sub-circuit board, a second sub-circuit board, a third sub-circuit board and a fourth sub-circuit board.

According to some exemplary embodiments, the main body region includes the first sub-circuit board, the second sub-circuit board, the third sub-circuit board, the fourth sub-circuit board and a bonding film, the fourth sub-circuit board includes a substrate film, a conductive film arranged on a side of the substrate film and an adhesive layer for pasting the substrate film and the conductive film, each of the second sub-circuit board and the third sub-circuit board includes a substrate film, conductive films arranged on opposite sides of the substrate film, and adhesive layers for pasting the substrate film and the conductive films, the bonding film is provided between the first sub-circuit board and the second sub-circuit board, between the second sub-circuit board and the third sub-circuit board, and between the third sub-circuit board and the fourth sub-circuit board.

According to some exemplary embodiments, the pressure sensor includes a first electrode and a second electrode located in a same conductive film.

According to some exemplary embodiments, a material of the first electrode and a material of the second electrode include copper.

According to some exemplary embodiments, a material of the substrate film and a material of the cover layer include polyimide.

In another aspect, a display device including the flexible printed circuit described above is provided.

In another aspect, a display device is provided, and the display device includes: the flexible printed circuit described above; a display panel; and a battery, wherein an orthographic projection of the battery on the display panel is spaced from an orthographic projection of the main body region on the display panel, and the orthographic projection of the battery on the display panel at least partially overlaps an orthographic projection of the protruding region on the display panel.

According to some exemplary embodiments, the orthographic projection of the battery on the display panel at least partially overlaps an orthographic projection of the pressure sensor on the display panel.

According to some exemplary embodiments, the display device further includes a spacer member arranged on a side of the display panel facing the pressure sensor, wherein the electromagnetic shielding layer is in contact with the spacer member.

BRIEF DESCRIPTION OF THE DRAWINGS

In order to more clearly explain the embodiments of the present disclosure or the technical solutions in a related art, the following will briefly introduce the accompanying drawings required in the embodiments or the description of the related art. Obviously, the drawings in the following description are only some embodiments of the present disclosure. For those ordinary skilled in the art, other drawings may be obtained based on these drawings without paying any inventive effort.

DETAILED DESCRIPTION OF EMBODIMENTS

Figure 1:
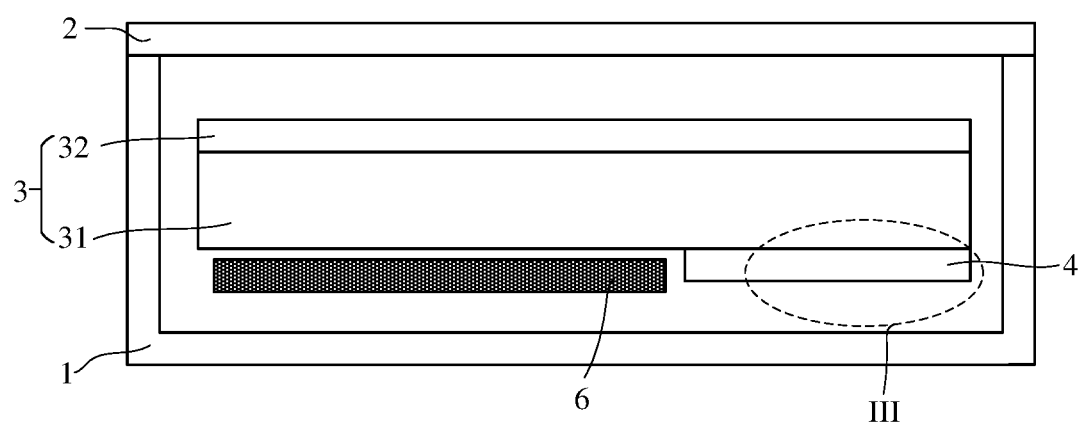
FIG. 1 shows a schematic diagram of a display device according to some embodiments of the present disclosure.

In order to make objectives, technical solutions and advantages of the present disclosure more apparent, the technical solutions of the present disclosure are clearly and completely described below with reference to the drawings of the embodiments of the present disclosure. Obviously, the described embodiments are only a part but not all of the embodiments of the present disclosure. Based on the embodiments of the present disclosure, all other embodiments obtained by those ordinary skilled in the art without carrying out inventive effort fall within the protection scope of the present disclosure.

Unless otherwise defined, technical terms or scientific terms used in the present disclosure shall be of the general meaning understood by the ordinary skilled in the art. The words "first," "second," and the like used in the present disclosure do not denote any order, quantity or importance, but are used to distinguish different components. The words "comprising," "including" and the like indicate that the element or item preceding the word contains the elements or items listed following the word as well as the equivalents, but do not exclude other elements or items. The words "connected," "coupled," or the like are not limited to physical or mechanical connections, but may include electrical connections, whether direct or indirect. The words "upper", "lower", "left", "right" and the like are only used to indicate relative positional relationship, and when the absolute position of the object described is changed, the relative positional relationship may also be correspondingly changed.

Herein, unless otherwise clearly specified and limited, the term "connected" may be understood in a broad sense, for example, "connected" may refer to a fixed connection, a detachable connection, or be connected into one; and may refer to a direct connection or an indirect connection through an intermediary.

Herein, unless otherwise specified and limited, the number of layers in the expressions "single-layer board", "double-layer board", "four-layer board", "six-layer board", etc. refers to the number of layers of the conductive film in the flexible printed circuit. For example, the "single-layer board" is provided with one layer of conductive film, the "double-layer board" is provided with two layers of conductive film, the "four-layer board" is provided with four layers of conductive film, and the "six-layer board" is provided with six layers of conductive film.

Herein, unless otherwise clearly specified and limited, the term "continuously extending" means that one component extends from another component, or that the two components are formed as a whole.

It should be noted that herein, unless otherwise specified and limited, the expression "thickness" means a size in a direction perpendicular to a display surface of a display panel.

Embodiments of the present disclosure provide a flexible printed circuit and a display device. The flexible printed circuit includes: a plurality of sub-circuit boards arranged in a stack, in which the plurality of sub-circuit boards includes at least a first sub-circuit board and a second sub-circuit board; and a pressure sensor arranged on the first sub-circuit board. The first sub-circuit board includes: a substrate film; a conductive film arranged on a side of the substrate film away from the second sub-circuit board; an adhesive layer arranged on a side of the conductive film away from the substrate film; a cover layer arranged on a side of the adhesive layer away from the substrate film; and an electromagnetic shielding layer arranged on a side of the cover layer away from the substrate film. At least a part of the conductive film is formed as an electrode of the pressure sensor. In the embodiments of the present disclosure, the electrode of the pressure sensor is arranged on the conductive film of the multi-layer board, which is beneficial to reduce a space occupied by the pressure sensor, and thus facilitates an installation of a large-capacity battery.

It should be understood that multiple signal lines may generally be integrated on the flexible printed circuit to transmit different types of signals. When many types of signal lines are provided on the flexible printed circuit, for example, when multiple signal lines for display signals, touch signals, fingerprint recognition signals, etc. are required at the same time, a difficulty of wiring the signal lines in the flexible printed circuit may increase. In this regard, at least a part of the flexible printed circuit may be formed to include a plurality of wiring layers, such as four or six wiring layers, etc., so as to facilitate an arrangement of multiple lines. In this way, multiple lines may be distributed in different layers, which may reduce a mutual interference between different types of lines. In addition, in a process of producing the flexible printed circuit with a plurality of wiring layers, it is also necessary to form an insulating layer (and a corresponding adhesive layer) between adjacent wiring layers. In order to avoid a signal crosstalk between different wiring layers, it may be necessary to form a (electromagnetic signal) shielding layer between different lines.

The embodiments of the present disclosure provide a display device, and a type of the display device is not limited. The display device may be a liquid crystal display (LCD) or an electroluminescent display device. In a case that the display device is an electroluminescent display device, the electroluminescent display device may be an organic electroluminescent display device (e.g., Organic Light-Emitting Diode (OLED)) or a quantum dot electroluminescent display device (e.g., Quantum Dot Light Emitting Diodes (QLED)).

FIG. 1 shows a schematic diagram of a display device. As shown in FIG. 1, a main structure of the display device includes a frame 1, a cover plate 2, a display panel 3, and a flexible printed circuit 4. In a case that the display device is a liquid crystal display device, the display device may further include a backlight assembly. Here, the display panel 3 may be a flexible display panel or a rigid display panel. In a case that the display panel 3 is a flexible display panel, the display device is a flexible display device.

For example, an upper side of the display panel 3 shown in FIG. 1 is a display side, and a lower side is a non-display side. After being bonded, the flexible printed circuit 4 is bent and placed on the non-display side of the display panel 3, that is, bent to a back surface of the display panel 3, so as to achieve a large-screen design of a display screen.

For example, the display device provided by the embodiments of the present disclosure may be any product or component with a display function, such as a television, a digital camera, a mobile phone, a tablet computer, and so on.

As shown in FIG. 1, the frame 1 has a U-shaped longitudinal section. The display panel 3, the flexible printed circuit 4 and other accessories are arranged in the frame 1. The flexible printed circuit 4 is arranged under the display panel 3 (that is, on the back surface which is away from a display surface of the display panel 3). The cover plate 2 is arranged on a side of the display panel 3 away from the flexible printed circuit 4. In a case that the display is a liquid crystal display including a backlight assembly, the backlight assembly is arranged between the display panel 3 and the flexible printed circuit 4.

As shown in FIG. 1, the display panel 3 may include a display unit 31 and a touch layer 32. The touch layer 32 may be arranged on a light exit side of the display unit 31. Exemplarily, in a case that the display panel 3 is an OLED display panel, the touch layer 32 may be arranged on an encapsulation layer of the OLED display panel (the touch layer 32 may be in direct contact with the encapsulation layer, or other layers such as a planarization layer may be provided between the touch layer and the encapsulation layer). The encapsulation layer may be an encapsulation substrate or an encapsulation film. In a case that the display panel 3 is a liquid crystal display panel, the touch layer 32 may be embedded in a liquid crystal layer (i.e., In cell), or the touch layer 32 may be arranged between a color filter substrate and an upper polarizer (i.e., On cell). A position of the touch layer 32 is not limited to this. For example, the touch layer 32 may also be arranged inside the display panel 3. Exemplarily, the touch layer 32 may be arranged on a side of the cover plate 2 close to the display panel 3.

Figure 2:
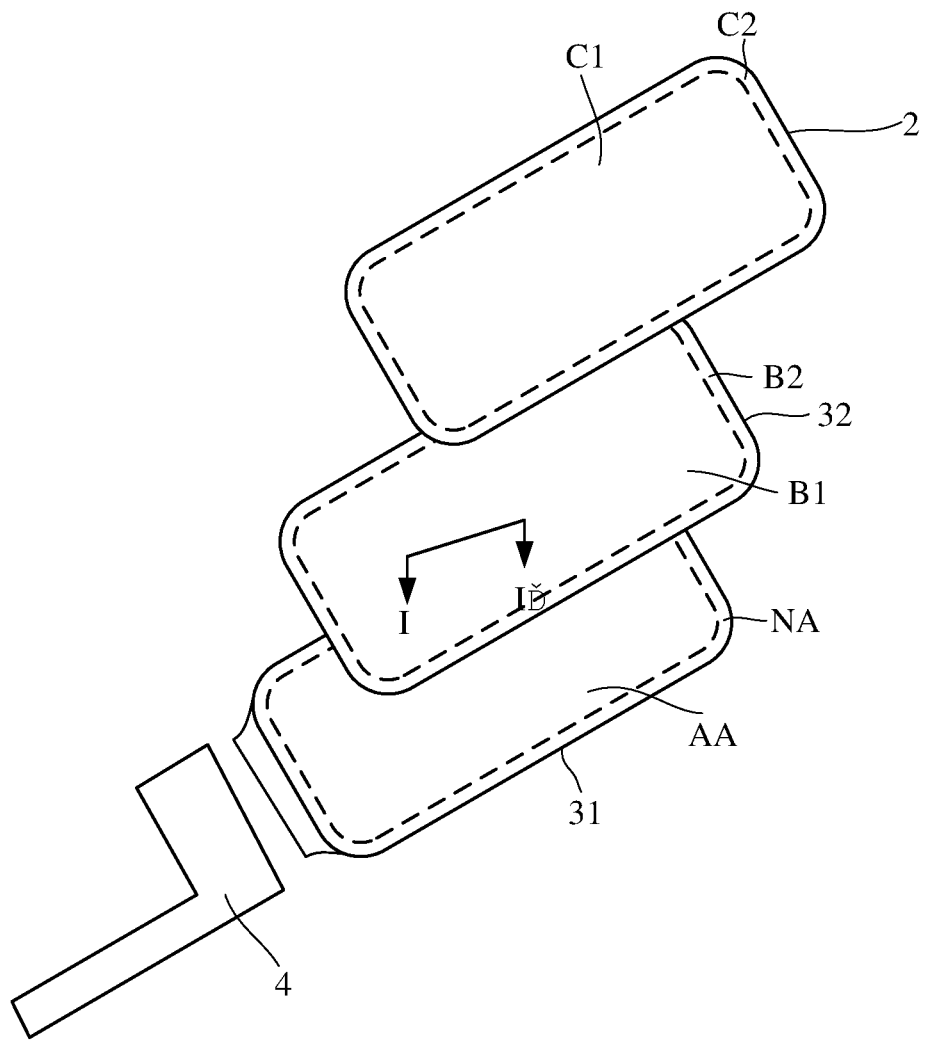
FIG. 2 shows a partially exploded schematic diagram of a display device provided by some embodiments of the present disclosure.

FIG. 2 shows a partially exploded schematic diagram of a display device provided by some embodiments of the present disclosure. Referring to FIG. 1 and FIG. 2 in combination, the display unit 31 may include a display region AA and a non-display region NA located on at least one side of the display region AA. In FIG. 2, the non-display region NA surrounding the display region AA is illustrated by way of example. The display region AA may be defined as an area in which an image is displayed, and the display region AA may include a plurality of sub-pixels for obtaining an image. The non-display region NA may be defined as an area in which no image is displayed, and the non-display region NA is used for wiring. For example, a gate driving circuit may be provided in the non-display region NA. In other words, the non-display region may also be referred to as a wiring region or a border.

In a case that the display panel 3 includes the touch layer 32, the touch layer 32 may be provided on the display unit 31. The touch layer 32 may acquire coordinate information from an external input (for example, user's finger touch). That is, the touch layer 32 may be a touch panel for sensing user's touch, or may be a fingerprint sensing panel for acquiring fingerprint information of user's finger. For example, the touch layer 32 may sense the external input by a capacitive manner. It should be noted that the sensing manner of the touch layer 32 in the embodiments of the present disclosure includes but is not limited to the implementations described above, and other suitable sensing manners may fall within the scope of protection of the embodiments of the present disclosure.

Figure 3A:
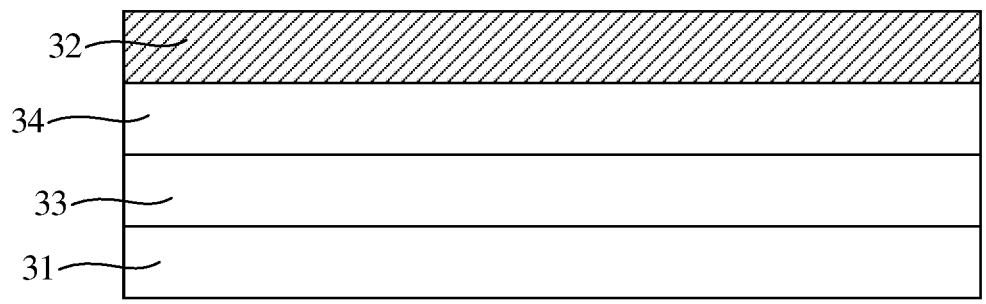
FIG. 3A and FIG. 3B respectively show schematic cross-sectional views of the display device according to some embodiments of the present disclosure taken along line I-I' of FIG. 2.
Figure 3B:
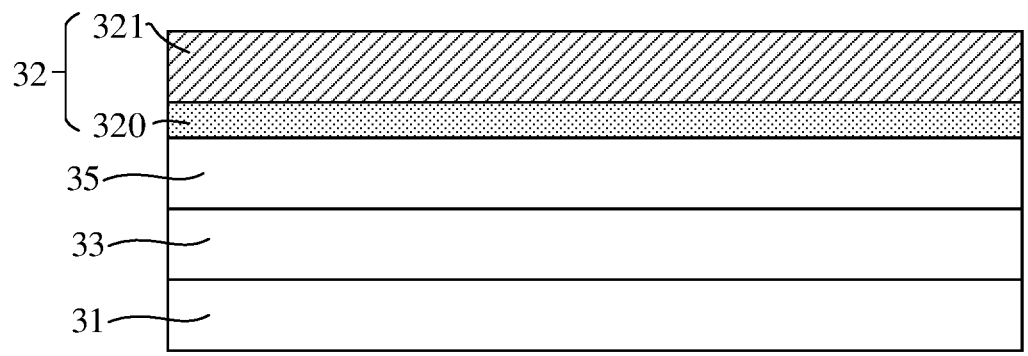

FIG. 3A and FIG. 3B respectively show schematic cross-sectional views of the display device according to some embodiments of the present disclosure taken along line I-I' of FIG. 2. In some embodiments, referring to FIG. 3A, the touch layer 32 may be formed on the display unit 31 through a continuous process. That is, the touch layer 32 may be formed directly on the display unit 31 after the display unit 31 is formed. Referring to FIG. 3A, for example, when forming the touch layer 32 in an electroluminescent display device, the touch layer 32 may be formed directly on the encapsulation layer 33. In addition, in order to avoid damaging the encapsulation layer 33 when forming the touch layer 32 on the encapsulation layer 33, a buffer layer 34 may be formed on the encapsulation layer 33 before forming the touch layer 32 on the encapsulation layer 33. In other embodiments, referring to FIG. 3B, the touch layer 32 may be formed as a separate element, and the touch layer 32 may be pasted on the display unit 31 by using an adhesive layer 35. In a case that the touch layer 32 is formed as a separate element (for example, a separate film layer), the touch layer 32 may further include a carrier film for carrying a touch electrode. For example, in the embodiment shown in FIG. 3B, the touch layer 32 may include a touch electrode layer 321 and a carrier film 320 for carrying the touch electrode layer.

For example, the carrier film 320 may be a resin film, a glass substrate, a composite film, etc. The adhesive layer 35 may be a pressure sensitive adhesive (PSA), an optical clear adhesive (OCA), an optical clear resin (OCR), or the like.

It should be noted that, in the embodiment shown in FIG. 2, the display panel 3 may have a rectangular shape in the plan view. The "rectangular shape" here includes not only a substantially rectangular shape, but also a shape similar to a rectangle in consideration of process conditions. On this basis, the display panel 3 has a long side and a short side. In some embodiments, the long side and the short side of the display panel 3 form a right angle at each intersection position (that is, at a corner). In other embodiments, the corner of the display panel 3 is curved, that is, the corner is smooth.

In combination with the above embodiments, referring to FIG. 2, the touch layer 32 may overlap the display unit 31. In some embodiments, the touch layer 32 may have substantially the same size as the display unit 31. That is, as shown in FIG. 3A and FIG. 3B, the sides of the touch layer 32 may be aligned with the sides of the display unit 31, but the embodiments of the present disclosure are not limited to this. Optionally, the touch layer 32 may only overlap a part of the display unit 31, for example, the touch layer 32 may at least partially overlap the display region AA of the display unit 31.

It should be noted that the touch layer 32 may include a touch region B1 provided with a plurality of touch electrodes and a peripheral region B2 arranged at a periphery of the touch region B1 and provided with touch leads electrically connected to the touch electrodes. In a case that the touch layer 32 has substantially the same size as the display unit 31, the touch region B1 corresponds to the display region AA, and the peripheral region B2 corresponds to the non-display region NA.

On this basis, as shown in FIG. 2, the cover plate 2 may include a light-transmitting region C1 and a light-shielding region C2. The light-transmitting region C1 may at least partially overlap the display region AA of the display unit 31, and the light-transmitting region C1 may transmit light generated from the display unit 31 to the outside so as to be viewed by human eyes. The light-shielding region C2 may be arranged at a periphery of the light-transmitting region C1, and may at least partially overlap the non-display region NA of the display unit 31.

Figure 4:
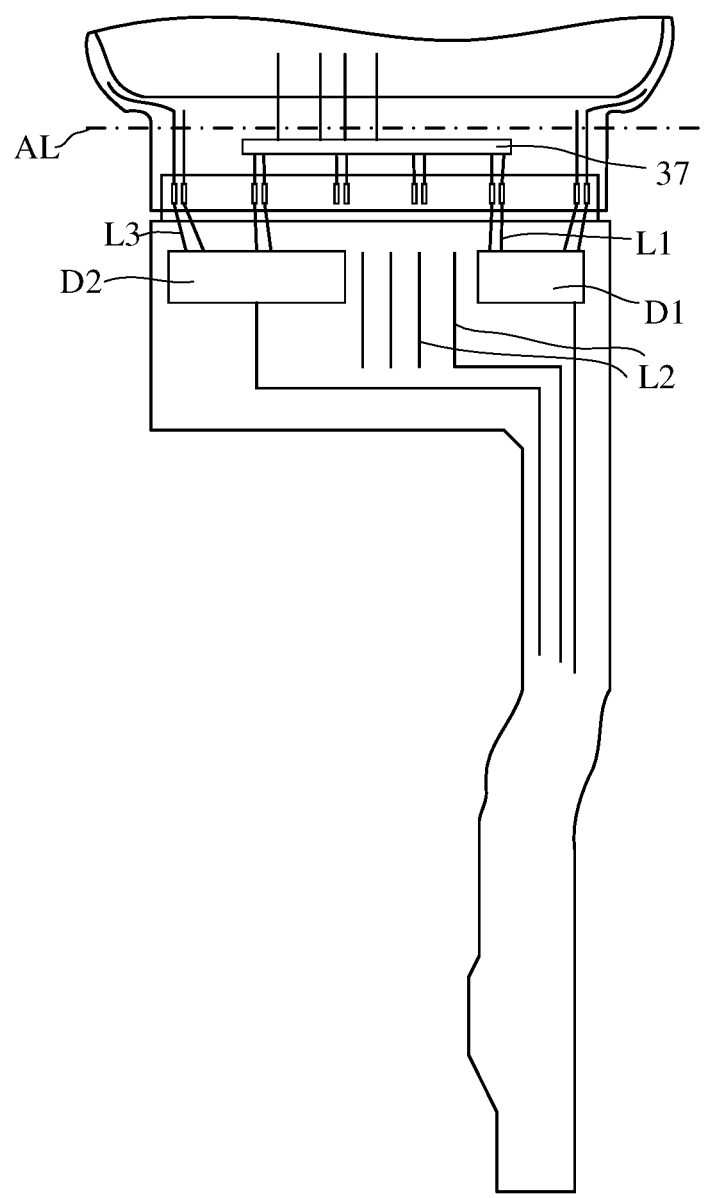
FIG. 4 shows a schematic plan view of a flexible printed circuit according to some exemplary embodiments of the present disclosure, in which a connection between the flexible printed circuit and the display panel is shown.
Figure 5:
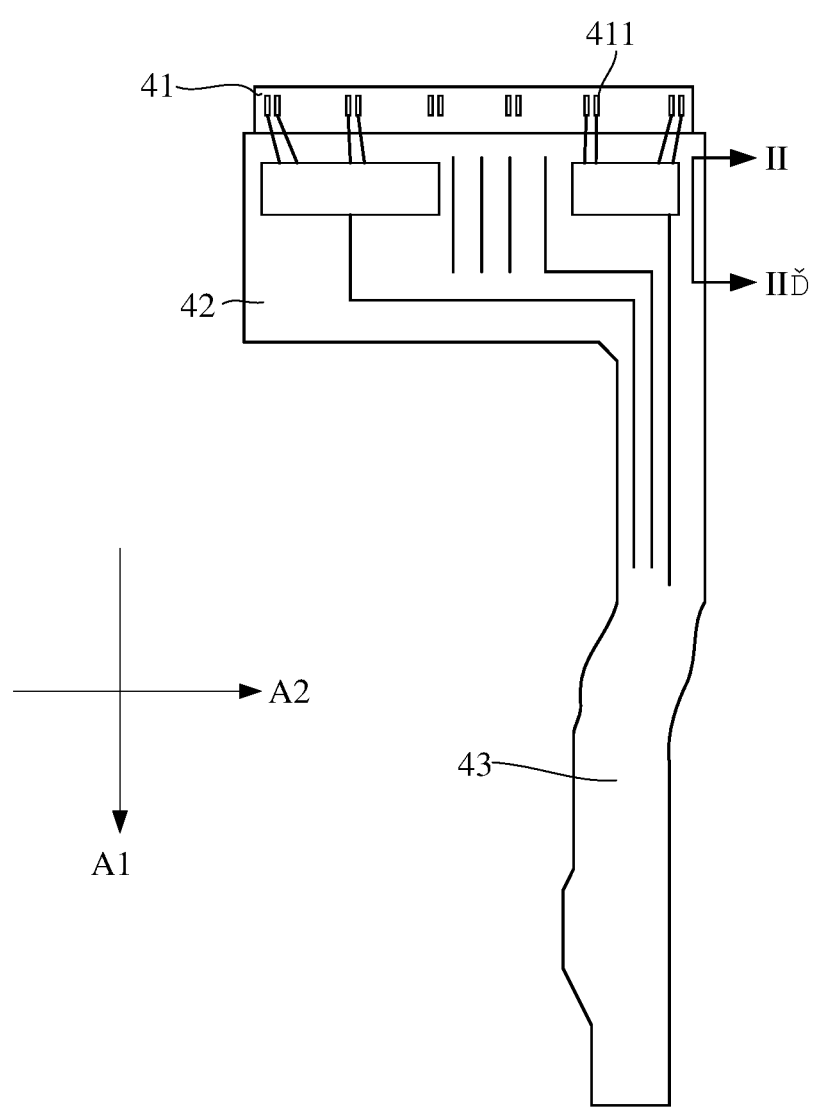
FIG. 5 shows a schematic plan view of a flexible printed circuit according to some exemplary embodiments of the present disclosure.

FIG. 4 shows a schematic plan view of a flexible printed circuit according to some exemplary embodiments of the present disclosure, in which a connection between the flexible printed circuit and the display panel is shown. FIG. 5 shows a schematic plan view of a flexible printed circuit according to some exemplary embodiments of the present disclosure. As shown in FIG. 2, FIG. 4 and FIG. 5 in combination, the flexible printed circuit 4 may be bent along line AL toward the non-display side of the display panel 3, so that the flexible printed circuit 4 is located on the back surface of the display panel 3. The flexible printed circuit 4 may include a bonding region 41, a main body region 42 and an extending region 43. The extending region 43 and the bonding region 41 are located on opposite sides of the main body region 42, respectively.

The bonding region 41 of the flexible printed circuit 4 may include a plurality of bonding pins 411. The non-display region NA of the display panel 3 may include a plurality of bonding pads. The plurality of bonding pins 411 are respectively bonded to the plurality of bonding pads so as to realize the bonding of the flexible printed circuit 4 and the display panel 3.

For example, in some embodiments, as shown in FIG. 4, the non-display region NA of the display panel 3 further includes a driving circuit IC 37. Data signals, power signals and so on transmitted by the main board are transmitted to the driving circuit IC 37 through the lines on the flexible printed circuit 4 (which may be collectively referred to as, for example, data signal control lines), and then processed by the driving circuit IC 37, and finally output to the display panel 3, so as to drive the display panel 3 for display.

The main body region 42 of the flexible printed circuit 4 may include one or more driving devices, such as a display driving device D1 and/or a touch driving device D2. The main body region 42 of the flexible printed circuit 4 may further include one or more lines. For example, the lines may include a first line L1, a second line L2, and a third line L3. Exemplarily, the first line L1 may be a signal line for transmitting data required for display, the second line L2 may be a power line L2, and the third line L3 may be a touch line L3. The signal line L1 may be electrically connected to the display driving device D1, and the touch line L3 may be electrically connected to the touch driving device D2.

For example, the driving device may include a driving IC chip. The driving IC chip may be integrated to the flexible printed circuit 4 by a plurality of manners (i.e., packaging manners), such as Tape Carrier Package (TCP), Chip on Film (COF) package, and the like. In the TCP manner, the flexible printed circuit may include a plurality of contact pads, and a plurality of pins of the driving IC chip are soldered to the plurality of contact pads of the flexible printed circuit in a one-to-one correspondence (such as eutectic soldering), or electrically connected to the plurality of contact pads in a one-to-one correspondence through anisotropic conductive film (ACF), and a soldered portion is protected by, for example, at least an epoxy resin. In order to increase a bendability of the flexible printed circuit in the TCP manner, a slit may be formed in a packaging portion. In the COF packaging manner, the flexible printed circuit may include a plurality of contact pads, and the plurality of pins of the driving IC chip are directly crimped on the plurality of contact pads of the flexible printed circuit through ACF, so that the plurality of pins of the driving IC chip are electrically connected to the plurality of contact pads of the flexible printed circuit in a one-to-one correspondence. For example, a size and an arrangement of the contact pads on the flexible printed circuit for combining with the driving IC chip may be adjusted according to different packaging manners or the driving IC chip to be packaged. For example, the contact pads may be arranged in a long strip or in a rectangle. The embodiments of the present disclosure do not limit the manner of packaging the driving IC chip.

It should be noted that the number of the first line L1, the number of the second line L2, and the number of the third line L3 are not limited, and each may be one or more. Here, "more" may be at least two, for example.

Continuing to refer to FIG. 4 and FIG. 5, one or more lines included in the main body region 42 may extend to the extending region 43 and may be electrically connected to the main board through a bonding region or a golden finger included in the extending region 43. For example, the first line L1 and the second line L2 may extend to the extending region 43. In this way, the data signals, power signals, etc. transmitted by the main board may be transmitted to the display panel 3 through the lines on the flexible printed circuit 4.

In the embodiments of the present disclosure, the flexible printed circuit 4 may include a pressure sensor 10. The pressure sensor 10 may be used to acquire touch pressure information about a user's touch operation. For example, the pressure sensor 10 may acquire information indicating whether the user's touch operation involves pressure or not. In a non-limiting example, the pressure sensor 10 may acquire information about a magnitude of a touch pressure.

Figure 6A:
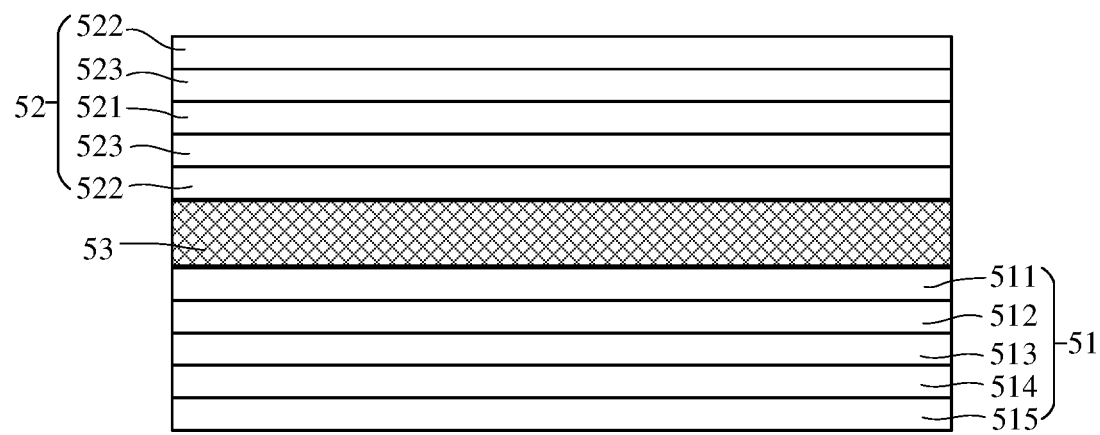
FIG. 6A to FIG. 6C respectively show cross-sectional views of the flexible printed circuit according to some embodiments of the present disclosure taken along line II-II' in FIG. 5.
Figure 6B:
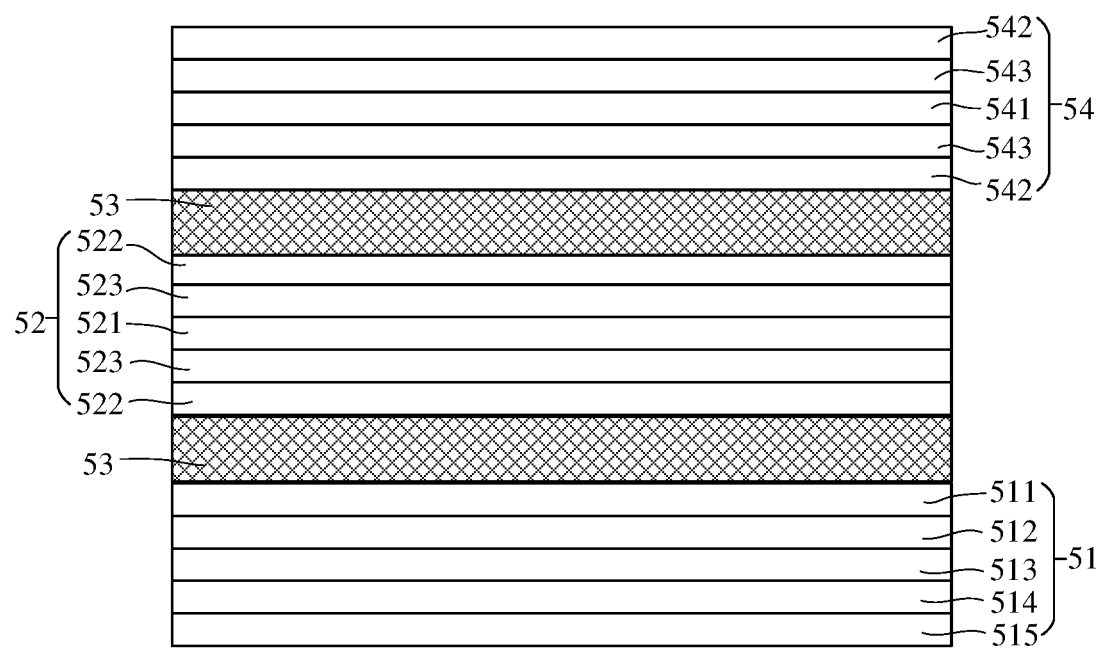
Figure 6C:
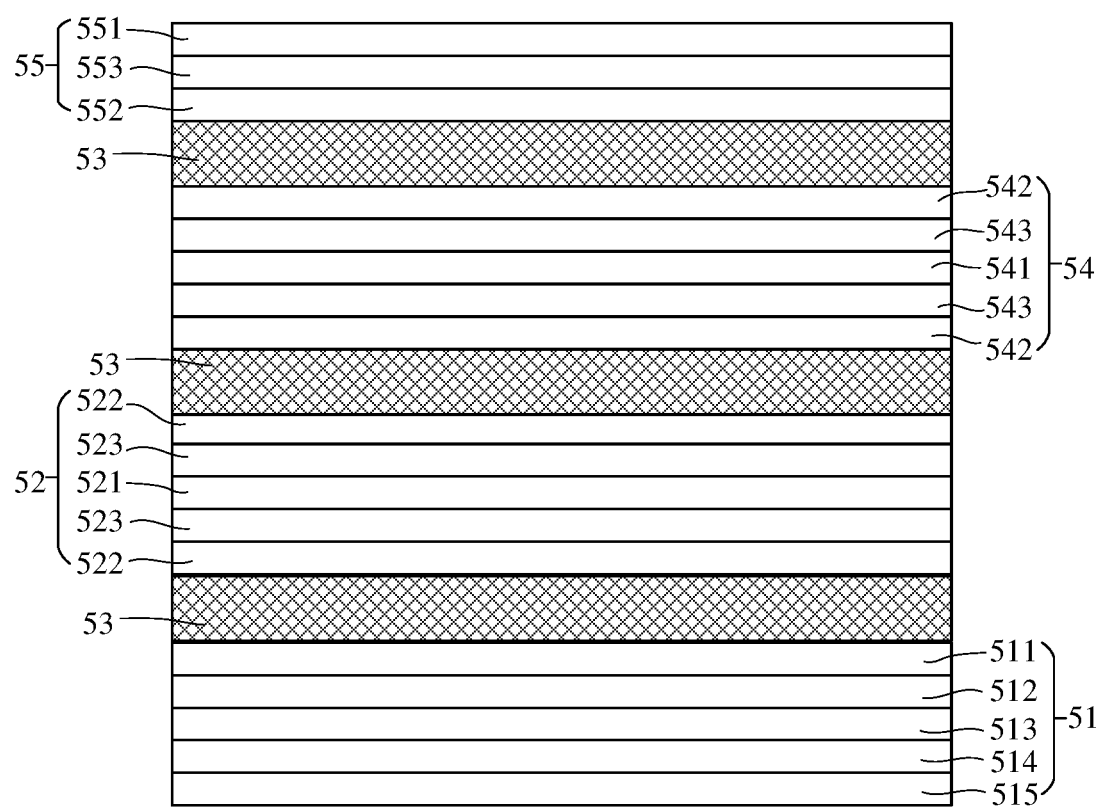

FIG. 6A to FIG. 6C respectively show cross-sectional views of a flexible printed circuit according to some embodiments of the present disclosure taken along line II-II' in FIG. 5. As shown in FIG. 6A to FIG. 6C, in some embodiments, the main body region 42 has a multi-layer board structure.

For example, as shown in FIG. 6A, the main body region 42 may include a first sub-circuit board 51 and a second sub-circuit board 52. As shown in FIG. 6B, the main body region 42 may include a first sub-circuit board 51, a second sub-circuit board 52 and a third sub-circuit board 54.

For example, as shown in FIG. 6C, the main body region 42 has a six-layer board structure.

As shown in FIG. 6C, the six-layer board structure of the main body region 42 may be a combination of "1 layer+2 layers+2 layers+1 layer". The main body region 42 may include a first sub-circuit board 51, a second sub-circuit board 52, a third sub-circuit board 54, a fourth sub-circuit board 55 and a bonding film 53. For example, each sub-circuit board may be a copper clad laminate. The bonding film 53 may contain an adhesive material such as PP glue for bonding two adjacent sub-circuit boards. For example, a plurality of sub-circuit boards are bonded and pressed to form a fixed connection as a whole functional unit.

The first sub-circuit board 51 may include: a substrate film 511; a conductive film 512 arranged on a side of the substrate film 511; an adhesive layer 513 arranged on a side of the conductive film 512 away from the substrate film 511; a cover layer 514 arranged on a side of the adhesive layer 513 away from the substrate film 511; and an electromagnetic shielding layer 515 arranged on a side of the cover layer 514 away from the substrate film 511. For example, at least a part of the conductive film 512 may be formed as an electrode of the pressure sensor 10.

For example, the substrate film and the cover layer described above may include a flexible material such as polyimide or polyester. A material of the electromagnetic shielding layer is not particularly limited, as long as it has predetermined rigidity and strength and has heat transfer and electromagnetic shielding functions. For example, the electromagnetic shielding layer may include copper (Cu), nickel (Ni), ferrite, silver (Ag), or alloys thereof. For another example, the electromagnetic shielding layer may include one or more of conductive rubber, conductive cloth, conductive foam, and conductive shielding glue. By providing the electromagnetic shielding layer, an interference of external signals to the signals transmitted by various lines on the flexible printed circuit and to the pressure sensor may be shielded.

In this embodiment, the first sub-circuit board 51 has a single-layer board structure, and the pressure sensor 10 is arranged on the single-layer board. With such a design, a thickness of the flexible printed circuit at the pressure sensor may be reduced.

In the embodiments of the present disclosure, several exemplary embodiments of the electrode of the pressure sensor 10 will be described with reference to FIG. 7A and FIG. 7B respectively. However, it should be understood that the pressure sensor 10 according to the embodiments of the present disclosure is not limited thereto. The pressure sensor 10 may be configured as any one of an electrostatic type, an inductive type, a strain gauge type, a piezoelectric type, and a capacitive type according to an operation method thereof.

Figure 7A:
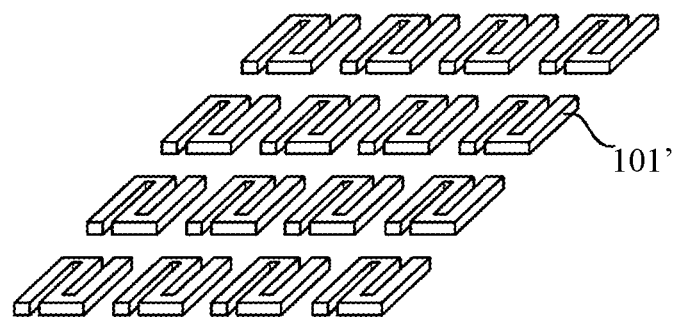
FIG. 7A shows a perspective view of an inductive type pressure sensor according to some exemplary embodiments of the present disclosure.

For example, FIG. 7A shows a perspective view of an inductive type pressure sensor according to some exemplary embodiments of the present disclosure. The pressure sensor 10 may be an inductive type pressure sensor. Referring to FIG. 7A, the inductive type pressure sensor 10' may include a plurality of electrodes 101'. For example, the electrode 101' may be an inductor, such as a coil. When the pressure sensor 10' operates, as a pressure applied by the user changes, a current induced in the electrode 101' may change accordingly. For example, when a conductor (e.g., a metal housing or a user's finger) approaches the electrode 101' due to the pressure applied by the user, the current induced in the electrode 101' may increase. The pressure sensor 10' may sense the pressure based on the change of current.

For example, the pressure sensor 10 may be a strain gauge type pressure sensor. Referring to FIG. 7A, the strain gauge type pressure sensor 10' may include an electrode 101'. When the strain gauge type pressure sensor 10' operates, as the pressure applied by the user changes, a length of the electrode 101' may change, and a resistance of the electrode 101' may also change accordingly. For example, when the pressure applied by the user increases, the resistance of the electrode 101' may increase accordingly. The pressure sensor 10' may sense the pressure based on the change of resistance.

Figure 7B:
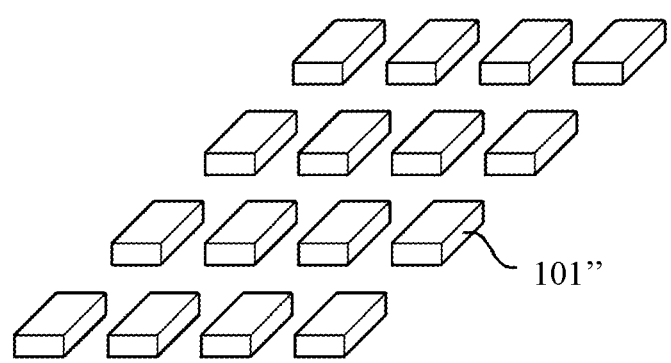
FIG. 7B shows a perspective view of a piezoelectric type pressure sensor according to some exemplary embodiments of the present disclosure.

For example, FIG. 7B shows a perspective view of a piezoelectric type pressure sensor according to some exemplary embodiments of the present disclosure. The pressure sensor 10 may be a piezoelectric type pressure sensor. Referring to FIG. 7B, the piezoelectric type pressure sensor 10" may include an electrode 101", and the electrode 101" may be formed of a piezoelectric material. When the piezoelectric type pressure sensor 10" operates, as the pressure applied by the user changes, the current of the electrode 101" converted due to a piezoelectric effect (that is, an induced current) may change accordingly. For example, when the pressure applied by the user increases, the converted current (i.e., the induced current) of the electrode 101" may increase. The pressure sensor 10" may sense the pressure based on the change of induced current.

In the embodiments of the present disclosure, the electrode 101', 101" may be arranged in the conductive film 512. In other words, at least a part of the conductive film 512 may be formed as the above-mentioned electrode of the pressure sensor 10.

For example, the pressure sensor 10 may be implemented as a self-capacitance type or a mutual-capacitance type, and at least a part of the conductive film 512 may be formed as an electrode of the pressure sensor 10. In some embodiments of the present disclosure, the conductive film 512 may include copper, that is, the conductive film 512 is a copper film layer.

Referring back to FIG. 6C, the second sub-circuit board 52 may include a substrate film 521, conductive films 522 arranged on opposite sides of the substrate film 521, and adhesive layers 523 for pasting the substrate film 521 and the conductive films 522. The third sub-circuit board 54 may include a substrate film 541, conductive films 542 arranged on opposite sides of the substrate film 541, and adhesive layers 543 for pasting the substrate film 541 and the conductive films 542. The fourth sub-circuit board 55 may include a substrate film 551, a conductive film 552 arranged on a side of the substrate film 551, and an adhesive layer 553 for pasting the substrate film 551 and the conductive film 552. The bonding film 53 is arranged between the first sub-circuit board 51 and the second sub-circuit board 52, between the second sub-circuit board 52 and the third sub-circuit board 54, and between the third sub-circuit board 54 and the fourth sub-circuit board 55.

For example, the substrate film described above may include a flexible material such as polyimide or polyester.

Figure 8:
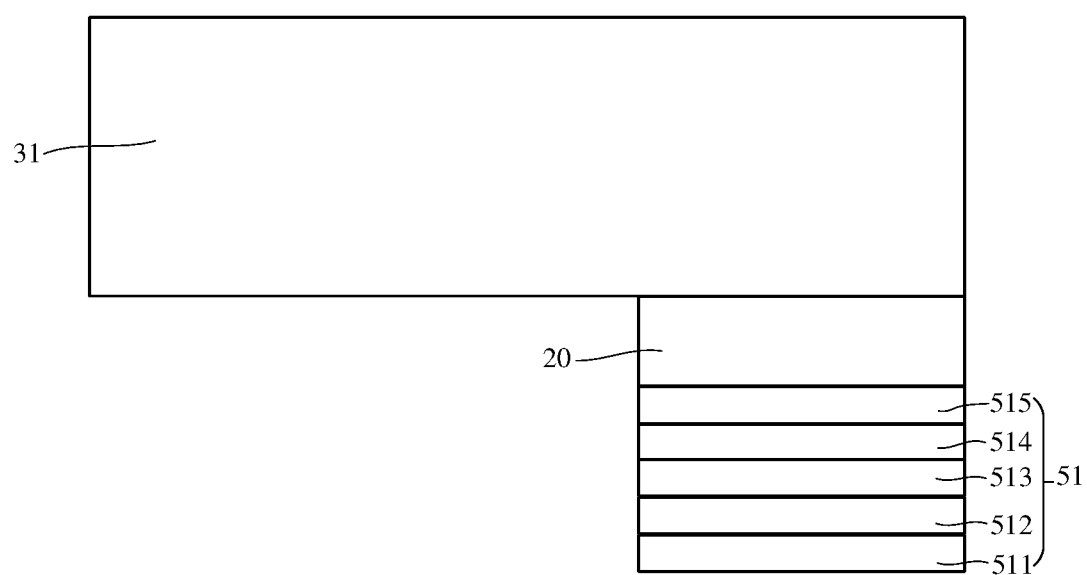
FIG. 8 shows a partial enlarged view of the display device according to some exemplary embodiments of the present disclosure at part III of FIG. 1.

FIG. 8 shows a partial enlarged view of the display device according to some exemplary embodiments of the present disclosure at part III of FIG. 1. Referring to FIG. 1, FIG. 6C and FIG. 8 in combination, at least a part of the flexible printed circuit 4 may be bent to the back surface of the display panel, so that the pressure sensor 10 is located on the back surface of the display panel 3.

As shown in FIG. 8, a spacer member 20 is provided on the back surface of the display panel 3. The spacer member 20 is arranged between the back surface of the display panel 3 and the flexible printed circuit 4. The spacer member 20 may reduce or eliminate a damage to the display panel 3 caused by an external impact. The spacer member 20 may absorb or disperse at least part of the external impact, and thus may protect the display panel 3. A material of the spacer member 20 is not particularly limited, as long as it is suitable for absorbing and/or dispersing impact. For example, the spacer member 20 may include polymer materials such as polyurethane-based resins, carbonate-based resins, propylene-based resins or ethylene-based resins, or rubber-based materials or foamed products thereof. For example, the spacer member 20 may include foam.

Referring to FIG. 6C and FIG. 8 in combination, when the flexible printed circuit 4 is bent to the back surface of the display panel 3, the first circuit sub-board 51 may be in contact with the spacer member 20. For example, the electromagnetic shielding layer 515 may be in contact with a surface of the spacer member 20 away from the display panel 3 (i.e., a lower surface of the spacer member 20 in FIG. 8).

In the embodiments of the present disclosure, a distance between the conductive film 512 and the electromagnetic shielding layer 515, that is, a separation distance between the conductive film 512 and the electromagnetic shielding layer 515 in a direction perpendicular to the display panel 3, is within a specified distance range. The specified distance range may be 34.5 microns to 40.5 microns. In this way, the pressure sensor 10 may operate normally.

An adhesive layer 513 and a cover layer 514 are provided between the conductive film 512 and the electromagnetic shielding layer 515. In the embodiments of the present disclosure, a thickness of the adhesive layer 513 may be designed so that the distance between the conductive film 512 and the electromagnetic shielding layer 515 is within the specified distance range described above. The thickness of the adhesive layer 513 may be designed to be 20 microns to 30 microns, for example, about 25 microns, so that the distance between the conductive film 512 and the electromagnetic shielding layer 515 is within the range of 34.5 microns to 40.5 microns.

Figure 9:
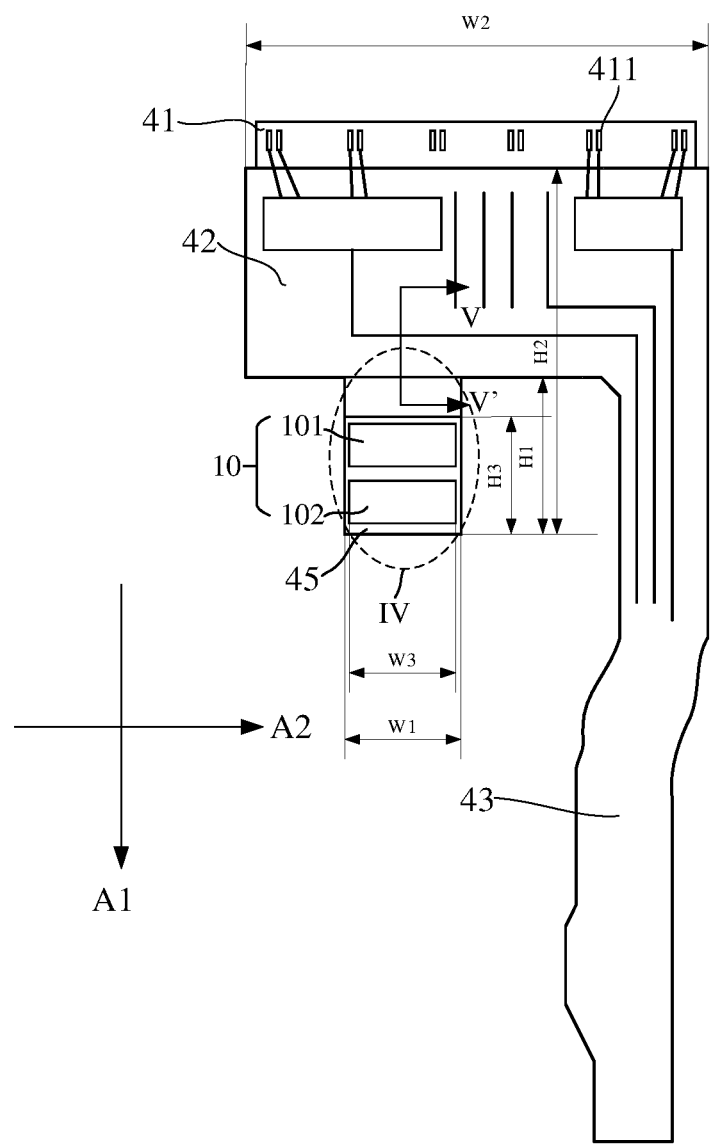
FIG. 9 shows a schematic plan view of a flexible printed circuit according to some exemplary embodiments of the present disclosure.
Figure 10A:
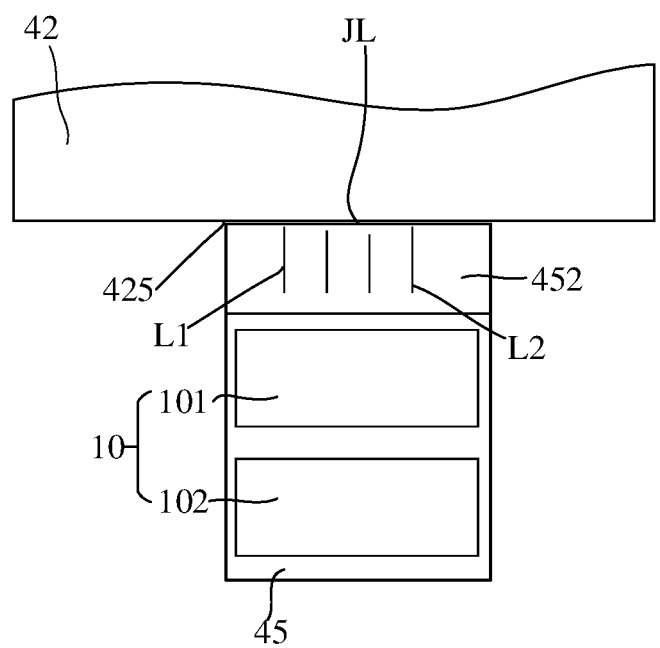
FIG. 10A and FIG. 10B respectively show partial enlarged views of the flexible printed circuit according to some exemplary embodiments of the present disclosure at part IV of FIG. 9.
Figure 10B:
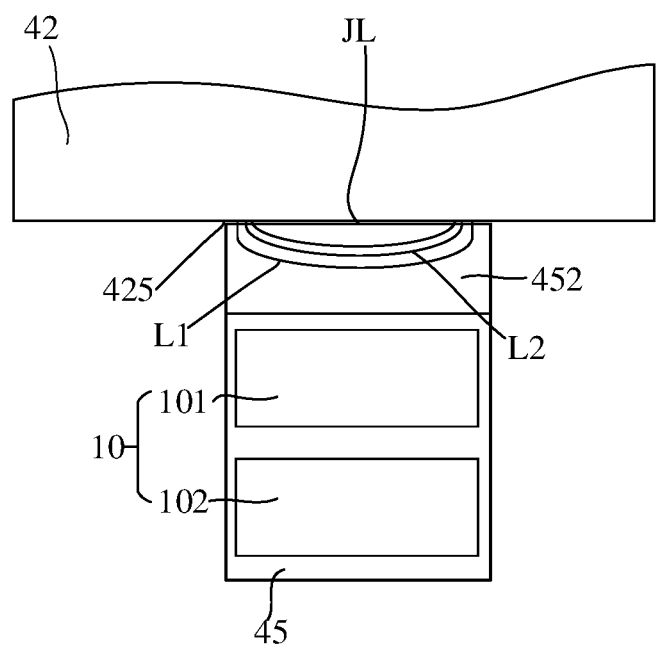
Figure 11:
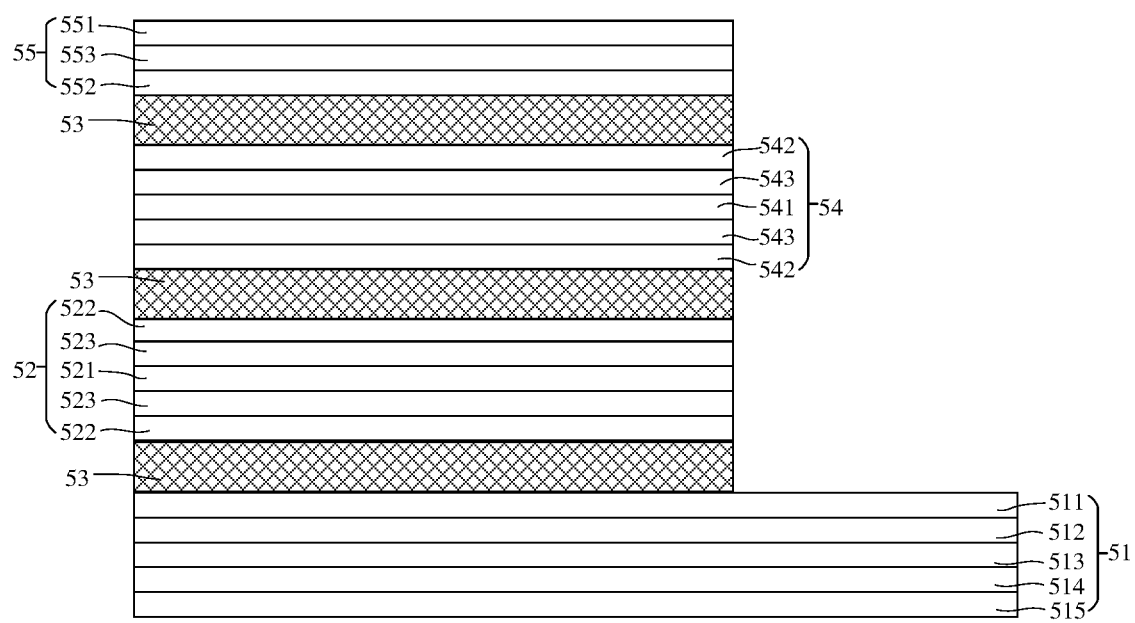
FIG. 11 shows a schematic cross-sectional view of the flexible printed circuit according to some exemplary embodiments of the present disclosure taken along line VV' in FIG. 9.

FIG. 9 shows a schematic plan view of a flexible printed circuit according to some exemplary embodiments of the present disclosure. FIG. 10A and FIG. 10B respectively show partial enlarged views of the flexible printed circuit according to some exemplary embodiments of the present disclosure at part IV of FIG. 9. FIG. 11 shows a schematic cross-sectional view of the flexible printed circuit according to some exemplary embodiments of the present disclosure taken along line VV' in FIG. 9.

Hereinafter, special features of some embodiments of the present disclosure will be described mainly in conjunction with FIG. 9 to FIG. 11. It should be understood that in a case of no conflict, these embodiments may utilize all the structures in the above-mentioned embodiments As shown in FIG. 9 to FIG. 11, the flexible printed circuit 4 may include a bonding region 41, a main body region 42, a protruding region 45 and an extending region 43. The protruding region 45 and the extending region 43 are located on a same side of the main body region 42, and the bonding region 41 and each of the protruding region 45 and the extending region 43 are respectively located on opposite sides of the main body region 42.

Referring to FIG. 11, the main body region 42 of the flexible printed circuit 4 has a thickness greater than that of the protruding region 45. For example, the main body region 42 may have a six-layer board structure, and the protruding region 45 may have a single-layer board structure. That is, in the embodiments of the present disclosure, the number of layers of the main body region 42 is greater than the number of layers of the protruding region 45, so that the protruding region 45 is formed as a thinned area with respect to the main body region 42.

As described above, the six-layer board structure of the main body region 42 may be a combination of "1 layer+2 layers+2 layers+1 layer". The main body region 42 may include the first sub-circuit board 51, the second sub-circuit board 52, the third sub-circuit board 54, the fourth sub-circuit board 55 and the bonding film 53. The protruding region 45 may be led out from the first sub-circuit board 51. That is, the first sub-circuit board 51 may protrude from the main body region 42, and a protruding portion of the first sub-circuit board 51 is formed as the protruding region 45.

In the embodiments of the present disclosure, the pressure sensor 10 may be arranged in the protruding region 45.

For example, the pressure sensor 10 may include a first electrode 101 and a second electrode 102. The first electrode 101 and the second electrode 102 may be located in a same conductive film, that is, both are located in the conductive film 512.

For example, the first electrode 101 and the second electrode 102 of the pressure sensor 10 may be the electrode 101' or the electrode 101" described above. In some embodiments, the first electrode 101 and the second electrode 102 may sense pressure based on the change of resistance. For example, as the pressure applied by the user changes, the length of the electrode 101' may change, and the resistance of the electrode 101' may also change accordingly. The pressure sensor 10 may sense the pressure based on the change of resistance. In some embodiments, the first electrode 101 and the second electrode 102 may sense the pressure based on the change of capacitance. For example, as the pressure applied by the user changes, a capacitance between the first electrode 101 and a touch subject and a capacitance between the second electrode 102 and the touch subject also change. The pressure sensor 10 may sense the pressure based on the change of capacitance. An operating principle and method of the pressure sensor 10 may be referred to the above description for FIG. 7A and FIG. 7B.

It should be noted that the pressure sensor 10 in the embodiments of the present disclosure is not limited to the above types, and various types of pressure sensors known in the related art may be used.

In the embodiments of the present disclosure, the pressure sensor 10 may be integrated into a display device such as a mobile phone, a computer, etc., which may be used to sense a magnitude of the pressure of the touch subject (such as a user's finger) pressing the display screen, so as to control the display device to perform different operations based on different pressures.

Each of an orthographic projection of the main body region 42 on the display panel or the substrate film and an orthographic projection of the protruding region 45 on the display panel or the substrate film has a rectangular shape. The "rectangular shape" here includes not only a substantially rectangular shape, but also a shape similar to a rectangle in consideration of process conditions. On this basis, the main body region 42 has a long side and a short side. In some embodiments, the long side and the short side of the main body region 42 form a right angle at each intersection position (that is, at a corner). In other embodiments, the corner of the main body region 42 is curved, that is, the corner is smooth.

As shown in FIG. 9, a direction in which the short side of the main body region 42 extends is defined as a first direction A1, and a direction in which the long side extends is defined as a second direction A2.

As shown in FIG. 11, the protruding region 45 may include: a substrate film 511; a conductive film 512 arranged on a side of the substrate film 511; an adhesive layer 513 arranged on a side of the conductive film 512 away from the substrate film 511; a cover layer 514 arranged on a side of the adhesive layer 513 away from the substrate film 511; and an electromagnetic shielding layer 515 arranged on a side of the cover layer 514 away from the substrate film 511. For example, at least a part of the conductive film 512 may be formed as an electrode of the pressure sensor 10. For the structure of the pressure sensor 10, reference may be made to the description in each of the above embodiments, which will not be repeated here.

In the embodiments of the present disclosure, the pressure sensor 10 may be arranged on the protruding portion 45 of the flexible printed circuit 4, that is, in the protruding thinned region.

An orthographic projection of the main body region 42 on the substrate film 511 is adjacent to an orthographic projection of the protruding region 45 on the substrate film 511, and the orthographic projection of the main body region 42 on the substrate film 511 has an area greater than that of the orthographic projection of the protruding region 45 on the substrate film 511.

The protruding region 45 protrudes from a side surface 425 of the main body region 42, and an orthographic projection of the side surface 425 on the substrate film 511 is formed as a dividing line JL.

A ratio of a size H1 of the orthographic projection of the protruding region 45 on the substrate film 511 in a direction perpendicular to the dividing line JL (that is, the direction A1 in FIG. 9) to a size H2 of the orthographic projection of the main body region 42 on the substrate film 511 in the direction perpendicular to the dividing line is within a range of 0.5 to 1.5. For example, the size H1 of the orthographic projection of the protruding region 45 on the substrate film 511 in the direction perpendicular to the dividing line is about 13.4 mm; and/or the size H2 of the orthographic projection of the main body region 42 on the substrate film 511 in the direction perpendicular to the dividing line is about 13.5 mm.

For example, a ratio of a size W1 of the orthographic projection of the protruding region 45 on the substrate film 511 in a direction parallel to the dividing line JL (that is, the direction A2 in FIG. 9) to a size W2 of the orthographic projection of the main body region 42 on the substrate film 511 in the direction parallel to the dividing line is within a range of 0.15 to 1.

For example, an orthographic projection of an area where the pressure sensor 10 is located on the substrate film 511 has a substantially rectangular shape with a size W3 of about 15 mm in the direction A2 and a size H3 of about 10 mm in the direction A1.

The orthographic projection of the main body region 42 on the substrate film 511 has a substantially rectangular shape with a size of about 58 mm in the direction A2 and a size of about 13.5 mm in the direction A1.

Figure 12:
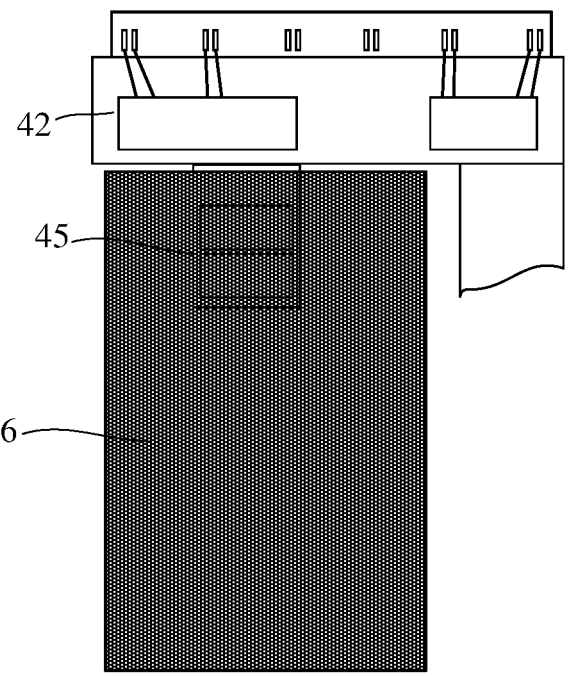
FIG. 12 shows a schematic plan view of the display device shown in FIG. 1.
Figure 13:
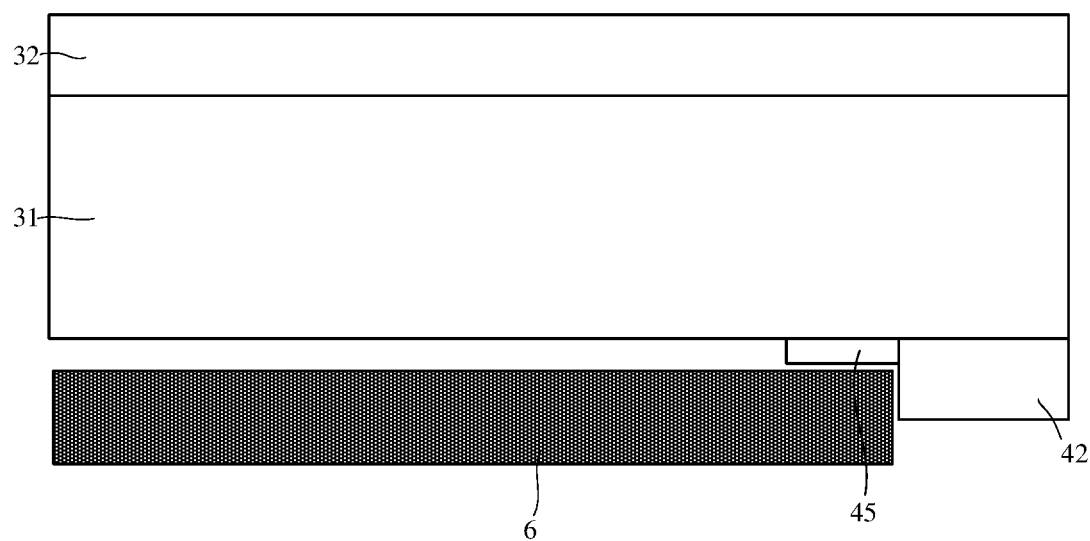
FIG. 13 shows a cross-sectional view of a display device according to some exemplary embodiments of the present disclosure.

FIG. 12 shows a schematic plan view of the display device shown in FIG. 1. FIG. 13 shows a cross-sectional view of a display device according to some exemplary embodiments of the present disclosure. Referring to FIG. 1 to FIG. 13 in combination, the display device may further include a battery 6. The battery 6 may supply power to various components of the display device.

It should be noted that the expression "battery" herein may include any form of power storage components, including but not limited to lithium battery, battery compartment with protective housing, and the like. For example, the battery 6 may include: a battery bag containing battery cells, a protective circuit module (PCM) (for example, circuit board) connection for electrically connecting a terminal pulled out from the battery bag, and a housing for protecting the PCM (for example, a PCM housing). According to various embodiments, the housing for containing the PCM may be fixed to the battery bag as an assembly structure for improving impact resistance, so that the components of a rechargeable battery (for example, battery bag, PCM, or terminal) may be prevented from being damaged even when an external impact is applied to the electronic device.

An orthographic projection of the battery 6 on the display panel 3 does not overlap the orthographic projection of the main body region 42 on the display panel 3. The main body region 42 has a thick six-layer board structure, and the battery 6 does not extend below the main body region 42.

The orthographic projection of the battery 6 on the display panel 3 at least partially overlaps the orthographic projection of the protruding region 45 on the display panel 3.

The orthographic projection of the battery 6 on the display panel 3 at least partially overlaps the orthographic projection of the pressure sensor 10 on the display panel 3. For example, the orthographic projection of the battery 6 on the display panel 3 covers the orthographic projection of the pressure sensor 10 on the display panel 3.

In the embodiments of the present disclosure, by designing the protruding region 45 thinner than the main body region 42, the battery 6 may extend below the protruding region 45. In this way, an area of the battery 6 equipped with the display device may be increased, and accordingly, a capacity of the battery 6 may be increased.

The pressure sensor 10 and the main body region 42 are spaced apart, that is, the orthographic projection of the pressure sensor 10 on the display panel 3 is spaced from the orthographic projection of the main body region 42 on the display panel 3. Accordingly, the protruding region 45 further includes a transition region 452. As shown in FIG. 9, the transition region 452 is located between the pressure sensor 10 and the main body region 42.

For example, an orthographic projection of the transition region 452 on the substrate film 511 has a substantially rectangular shape with a size of about 15 mm in the direction A2 and a size of about 3 mm in the direction A1.

In the embodiments of the present disclosure, the transition region 452 may be used as a wiring region. As shown in FIG. 9, at least some of the lines (for example, the first line L1, the second line L2, and the third line L3) may be arranged in the transition region 452. In this way, the area of the main body region 42 may be further reduced, for example, a width of the main body region 42 (the size in the direction A1 in FIG. 9) may be reduced, so that the capacity of the battery 6 may be further increased.

In the embodiments of the present disclosure, the pressure sensor is arranged on a single-layer board protruding from the main body region including the six-layer board. With such a design, the battery may be provided a position. When the display device is a small-size display device such as a mobile phone, such an avoidance design is particularly advantageous, and the capacity of the battery may be increased.

In a specific implementation process, the flexible printed circuit 4 may be bent to the back surface of the display panel to realize a narrow frame design of the display device. The display device provided by the embodiments of the present disclosure may be any product or component with a display function, such as a mobile phone, a tablet computer, a television, a display, a notebook computer, a digital photo frame, a navigator, and so on. The other indispensable components of the display device may be understood by those ordinary skilled in the art, which will not be repeated here and should not be used as a limitation to the embodiments of the present disclosure.

The above descriptions are only specific embodiments of the present disclosure, and the protection scope of the present disclosure is not limited thereto. Any changes or substitutions that may be easily envisaged by those skilled in the art within the technical scope disclosed in the present disclosure should be covered within the protection scope of the present disclosure. Therefore, the scope of protection of the present disclosure should be determined by the scope of protection defined by the claims.

What is claimed is:

1. A flexible printed circuit, comprising:
    a plurality of sub-circuit boards arranged in a stack, wherein the plurality of sub-circuit boards comprise at least a first sub-circuit board and a second sub-circuit board; and
    a pressure sensor arranged on the first sub-circuit board, wherein the first sub-circuit board comprises:
        a substrate film;
        a conductive film arranged on a side of the substrate film away from the second sub-circuit board;
        an adhesive layer arranged on a side of the conductive film away from the substrate film;
        a cover layer arranged on a side of the adhesive layer away from the substrate film; and
        an electromagnetic shielding layer arranged on a side of the cover layer away from the substrate film,
    wherein at least a part of the conductive film is formed as an electrode of the pressure sensor.

2. The flexible printed circuit of claim 1, wherein the flexible printed circuit comprises a main body region and a protruding region, the main body region has a thickness in a first direction greater than a thickness of the protruding region in the first direction, and the first direction is perpendicular to a surface of the substrate film away from the second sub-circuit board; and
    wherein the pressure sensor is arranged in the protruding region.

3. The flexible printed circuit of claim 2, wherein the first sub-circuit board comprises a portion arranged in the main body region and another portion protruding with respect to the main body region, and
    wherein the another portion of the first sub-circuit board protruding with respect to the main body region forms the protruding region.

4. The flexible printed circuit of claim 2, wherein an orthographic projection of the pressure sensor on the substrate film is spaced from an orthographic projection of the main body region on the substrate film.

5. The flexible printed circuit of claim 4, wherein the protruding region comprises a transition region located between the pressure sensor and the main body region, and
    wherein the flexible printed circuit comprises a plurality of lines arranged in the transition region.

6. The flexible printed circuit of claim 2, wherein an orthographic projection of the main body region on the substrate film is adjacent to an orthographic projection of the protruding region on the substrate film.

7. The flexible printed circuit of claim 6, wherein an area of the orthographic projection of the main body region on the substrate film is greater than an area of the orthographic projection of the protruding region on the substrate film.

8. The flexible printed circuit of claim 7, wherein the protruding region protrudes from a side surface of the main body region, an orthographic projection of the side surface on the substrate film is formed as a dividing line, a ratio of a size of the orthographic projection of the protruding region on the substrate film in a direction perpendicular to the dividing line to a size of the orthographic projection of the main body region on the substrate film in the direction perpendicular to the dividing line is within a range of 0.5 to 1.5.

9. The flexible printed circuit of claim 8, wherein a ratio of a size of the orthographic projection of the protruding region on the substrate film in a direction parallel to the dividing line to a size of the orthographic projection of the main body region on the substrate film in the direction parallel to the dividing line is within a range of 0.15 to 1.

10. The flexible printed circuit of claim 8, wherein the size of the orthographic projection of the protruding region on the substrate film in the direction perpendicular to the dividing line is about 13.4 mm; and/or the size of the orthographic projection of the main body region on the substrate film in the direction perpendicular to the dividing line is about 13.5 mm.

11. The flexible printed circuit of claim 2, wherein the pressure sensor comprises a first electrode and a second electrode located in a same conductive film, and wherein a material of the first electrode and a material of the second electrode comprise copper.

12. A display device, comprising:

the flexible printed circuit of claim 2;

a display panel; and a battery, wherein an orthographic projection of the battery on the display panel is spaced from an orthographic projection of the main body region on the display panel, and the orthographic projection of the battery on the display panel at least partially overlaps an orthographic projection of the protruding region on the display panel.

13. The display device of claim 12, wherein the orthographic projection of the battery on the display panel at least partially overlaps an orthographic projection of the pressure sensor on the display panel.

14. The display device of claim 12, further comprising a spacer member arranged on a side of the display panel facing the pressure sensor, wherein the electromagnetic shielding layer is in contact with the spacer member.

15. The flexible printed circuit of claim 1, wherein a separation distance between the conductive film and the electromagnetic shielding layer in a first direction is within a range of 34.5 microns to 40.5 microns.

16. The flexible printed circuit of claim 15, wherein the adhesive layer has a thickness of about 25 microns in the first direction.

17. The flexible printed circuit of claim 1, wherein the main body region comprises a first sub-circuit board and a second sub-circuit board; or the main body region comprises a first sub-circuit board, a second sub-circuit board and a third sub-circuit board; or the main body region comprises a first sub-circuit board, a second sub-circuit the main body region comprises a first sub-circuit board, a second sub-circuit board, a third sub-circuit board and a fourth sub-circuit board.

18. The flexible printed circuit of claim 17, wherein the main body region comprises the first sub-circuit board, the second sub-circuit board, the third sub-circuit board, the fourth sub-circuit board and a bonding film, and wherein the fourth sub-circuit board comprises a substrate film, a conductive film arranged on a side of the substrate film, and an adhesive layer for pasting the substrate film and the conductive film, and wherein each of the second sub-circuit board and the third sub-circuit board comprises a substrate film, conductive films arranged on opposite sides of the substrate film, and adhesive layers for pasting the substrate film and the conductive films, and wherein the bonding film is provided between the first sub-circuit board and the second sub-circuit board, between the second sub-circuit board and the third sub-circuit board, and between the third sub-circuit board and the fourth sub-circuit board.

19. The flexible printed circuit of claim 1, wherein a material of the substrate film and a material of the cover layer comprise polyimide.

20. A display device comprising the flexible printed circuit of claim 1.

* * * * *